United States Patent
Lei et al.

(10) Patent No.: US 7,985,942 B2
(45) Date of Patent: Jul. 26, 2011

(54) METHOD OF PROVIDING CONSISTENT QUALITY OF TARGET MATERIAL REMOVAL BY LASERS HAVING DIFFERENT OUTPUT PERFORMANCE CHARACTERISTICS

(75) Inventors: Weisheng Lei, Portland, OR (US); Glenn Simenson, Portland, OR (US); Jeff Howerton, Portland, OR (US); Mark Unrath, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 782 days.

(21) Appl. No.: 11/131,432

(22) Filed: May 17, 2005

(65) Prior Publication Data
US 2005/0265408 A1    Dec. 1, 2005

Related U.S. Application Data

(60) Provisional application No. 60/575,228, filed on May 28, 2004.

(51) Int. Cl.
*B23K 26/00* (2006.01)
(52) U.S. Cl. ............ 219/121.71; 219/121.7; 219/121.69
(58) Field of Classification Search .............. 219/121.71, 219/121.7, 121.69, 121.85
See application file for complete search history.

(56) References Cited

U.S. PATENT DOCUMENTS

| | | | |
|---|---|---|---|
| 5,656,186 A * | 8/1997 | Mourou et al. | 219/121.69 |
| 6,229,114 B1 * | 5/2001 | Andrews et al. | 219/121.72 |
| 6,328,732 B1 | 12/2001 | Donitzky et al. | |
| 6,333,485 B1 * | 12/2001 | Haight et al. | 219/121.68 |
| 6,809,291 B1 | 10/2004 | Neil et al. | |
| 6,864,457 B1 | 3/2005 | Alexander et al. | |
| 6,979,798 B2 | 12/2005 | Gu et al. | |
| 2002/0040893 A1 * | 4/2002 | Arai et al. | 219/121.71 |
| 2002/0074318 A1 | 6/2002 | Vogt et al. | |
| 2002/0170898 A1 * | 11/2002 | Ehrmann et al. | 219/121.73 |

FOREIGN PATENT DOCUMENTS

| | | |
|---|---|---|
| GB | 2290411 A | 12/1995 |
| JP | 10-99980 | 4/1998 |
| JP | 2004/114094 | 4/2004 |
| JP | 2006/224174 | 8/2006 |
| WO | WO 02/060636 | 8/2002 |
| WO | WO 03/074224 | 12/2003 |

OTHER PUBLICATIONS

International Searching Authority (US), Written Opinion, International Patent Application No. PCT/US2005/18676, dated Mar. 18, 2008, 6 pages.
UK Intellectual Property Office, Search Report, dated Feb. 18, 2008, 1 page.
UK Intellectual Property Office, Search Report, dated Jun. 18, 2007, 2 pages.

* cited by examiner

Primary Examiner — M. Alexandra Elve
(74) Attorney, Agent, or Firm — Stoel Rives LLP

(57) ABSTRACT

Laser pulse energy adjustments are motivated by an understanding of the effect of laser pulse width variations among different lasers on satisfying a quality metric associated with a laser-processed target. In a preferred embodiment, the adjustments normalize this effect among different lasers drilling vias in a target specimen. The number of pulses delivered to the target specimen to form each via can be modified, based on the pulse energy applied to the via location, to control different via quality metrics.

6 Claims, 5 Drawing Sheets

Laser A, Rep-Rate = 60 kHz,
Pulse Width = 23.4 ns, Pws = 1.16 W,
F = 0.73 J/cm$^2$ Laser B, Rep-Rate = 60 kHz,
Pulse Width = 136.6 ns, Pws = 1.10 W,
F = 0.70 J/cm$^2$ Laser A, Rep-Rate = 60 kHz,
Pulse Width = 23.4 ns, Pws = 1.31 W,
F = 0.82 J/cm$^2$,
F/$\sqrt{\tau}$ = 0.170 J/(cm$^2$ns$^{1/2}$)

Laser B, Rep-Rate = 60 kHz,
Pulse Width = 136.6ns, Pws = 3.16 W,
F = 1.99 J/cm$^2$, F/$\sqrt{\tau}$ = 0.171

Laser A, Rep-Rate = 60 kHz,
Pulse Width = 23.4 ns, Pws = 1.64 W,
$F = 1.04\ J/cm^2$, $F/\sqrt{\tau} = 0.214\ J/(cm^2 ns^{1/2})$ Laser B, Rep-Rate = 60 kHz,
Pulse Width = 136.6 ns, Pws = 3.93 W,
$F = 2.48\ J/cm^2$, $F/\sqrt{\tau} = 0.212\ J/(cm^2 ns^{1/2})$

METHOD OF PROVIDING CONSISTENT QUALITY OF TARGET MATERIAL REMOVAL BY LASERS HAVING DIFFERENT OUTPUT PERFORMANCE CHARACTERISTICS

RELATED APPLICATION

This application claims benefit of U.S. Provisional Patent Application No. 60/575,228, filed May 28, 2004.

COPYRIGHT NOTICE

© 2005 Electro Scientific Industries, Inc. A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR §1.71 (d).

TECHNICAL FIELD

This invention relates to use of a laser to drill vias in or otherwise process portions of material of electronic materials products and, in particular, to techniques of achieving with consistent high quality vias drilled or regions formed after material processing by laser-based systems exhibiting different operating output parameters.

BACKGROUND INFORMATION

Lasers are used to drill vias in and ablate material from electronic materials products, such as homogenous films, particulate filled resins, polyimides, and fiber reinforced polymers, either with or without metal cladding. The state of the art for solid state UV laser via drilling, for example, is to set and control or monitor the laser pulse energy by setting and controlling the laser pulse power and repetition rate for a desired process. Gaussian and imaged beam optics configurations are used in this manner. Other laser output performance characteristics vary among different lasers but remain within the specifications of the laser. Variation in laser output performance characteristics within the specified limits can result in differences in drilled via quality among multiple lasers, multiple beam positioning heads, and multiple laser systems, even when the same process is performed and same material is used on all systems. Specifically, variation in parameters within the specifications of the laser can cause, especially for blind via drilling applications, bottom copper cladding residue formation or nonhomogeneous melting, which results in differences in drilled via quality. In these applications, the pulse energy used during the drilling process can also affect via taper (ratio of bottom diameter to top diameter of via) as well as the quality of bottom copper cladding. A high quality blind via is one that has a desired bottom diameter and all thin film resin material removed from the bottom to exhibit a shiny copper cladding spot.

In general, the quality of a laser-processed material refers to a standard of excellence specified by a customer of laser processing equipment. Quality metrics differ for different laser processing operations. In addition to the quality metrics discussed above for via drilling, there are quality metrics for electrically conductive link severing, resistive material trimming, thick or thin film passive component thermal annealing, and substrate material scribing by laser outputs.

The quality metric for link severing governs the extent of operational damage to materials surrounding and underlying a link resulting from laser output interaction with the materials during severing of the link. The quality metric for laser trimming governs the minimization of an electro-optic response contributed by laser interaction during resistive material removal so as not to materially influence electrical measurements performed to determine when a specified resistance value has been achieved during resistive material trimming. The quality metric for laser annealing governs the degree of uniformity of distribution of heat applied to a component to change one of its characteristic parameters. The quality metric for laser scribing governs the minimization of microcrack formation in scribe line trench edges resulting from debris generated during cutting. This is a measure of the difference between laser pulse energy and the ablation energy threshold of the scribed material.

Moreover, the control of pulse energy is imperfect and is subject to short-term transients that may not be normalized by energy control devices present in the optical system. Such deviations in pulse energy can cause undesirable variations in via quality metrics.

What is desired, therefore, are techniques for achieving laser drilling of vias or other removal of material with consistent high quality from multiple lasers, multiple beam positioning heads, and multiple laser-based systems. It is also desired to achieve consistent removal of material by a laser, the output performance characteristics of which vary within specified limits over time.

SUMMARY OF THE INFORMATION

This invention entails adjusting laser pulse energy to account for the effects of laser pulse width variations among different lasers. Laser pulse energy adjustments are motivated by an understanding of the effect of laser pulse width variations among different lasers on satisfying a quality metric associated with a laser-processed target. In a preferred embodiment, the adjustments normalize the effect of pulse width variations among different lasers drilling vias in a target specimen. In addition, the number of laser pulses delivered to the target specimen to form each via can be modified, based on the pulse energy applied to the via location, to control different via quality metrics.

The conventional method of controlling a via drilling process entails controlling the pulse energy for the given process. The pulse energy, $E_p$, for use in performing a given process is determined by the fluence, F, desired for the process. The fluence, in J/cm², is calculated as $$F = \frac{E_P}{\frac{\pi}{4}D^2},$$

where $E_p$ is the pulse energy in J and D is the via diameter in cm. Applicants have found that drilling the same material at the same fluence level with lasers having different pulse widths results in different quality for the bottom copper cladding layer of a target specimen. Applicants have determined that a more appropriate parameter for predicting the bottom copper cladding quality for blind vias is $$F/\sqrt{\tau},$$

where F is the pulse fluence in J/cm² and τ is the laser pulse width in ns. Taking steps to keep $F/\sqrt{\tau}$ constant among lasers in a group of different lasers provides more consistent laser processing. This is true for laser processing operations other than via drilling and targets other than those having copper cladding.

Additional aspects and advantages will be apparent from the following detailed description of preferred embodiments, which proceeds with reference to the accompanying drawings.

DETAILED DESCRIPTION OF PREFERRED EMBODIMENTS

Preferred embodiments of this invention entail the use of a solid state UV laser to perform via drilling and ablation of electronic circuit materials such as homogenous films, particulate filled resins, polyimides, and fiber-reinforced polymers, either with or without metal cladding. The Model ABF circuit board dielectric material manufactured by Ajinomoto Fine-Techno Co., Inc., Kawasaki, Japan is the target material on which the following descriptions are based. The following descriptions are directed to via drilling, but the invention is also applicable to other methods of material removal, such as link severing, material trimming, annealing, and scribing.

Figure 1:
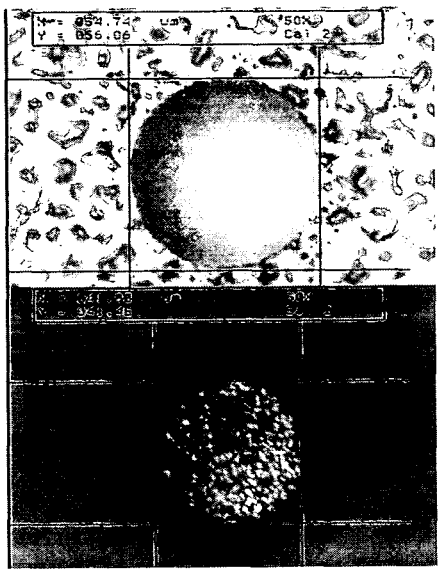
FIG. 1 is a set of four light microscope images showing differences in quality of 58 μm diameter blind vias drilled in the same copper-clad target material with different lasers emitting pulsed laser beams at the same fluence but with different pulse widths.
Figure 1:
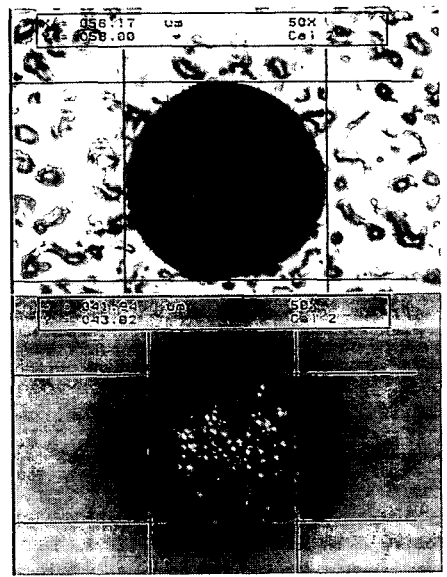

FIG. 1 is a set of four photographs of microscope images that illustrate the problem solved by the invention. FIG. 1 shows light microscope pictures of two 58 μm diameter vias drilled to depths of 35 μm-40 μm at approximately the same fluence level with 355 nm UV lasers having different pulse widths. The top two photographs represent images of blind vias focused at the upper surfaces of the target materials, and the bottom two photographs represent images of blind vias focused at a lower copper cladding layers at the bottoms of the vias. (The parameter Pws represents laser power at the work surface.) Comparison of the left-hand and right-hand side pairs of photographs shown in FIG. 1 reveals that, at the same fluence level, a shorter pulse width Laser A slightly melted the bottom copper layer and a longer pulse width Laser B barely cleaned the dielectric material off the bottom copper layer. Laser A and Laser B each emit 355 nm light beams. The brightness of the bottom copper layer is significantly different for the same fluence level with two different laser pulse widths.

Applicants' study of pulse width effects on via quality suggests that $F/\sqrt{\tau}$ is a more appropriate parameter for predicting the quality of the bottom copper cladding for blind vias, where F is the pulse fluence in J/cm² and τ is the laser pulse width in ns.

Figure 2:
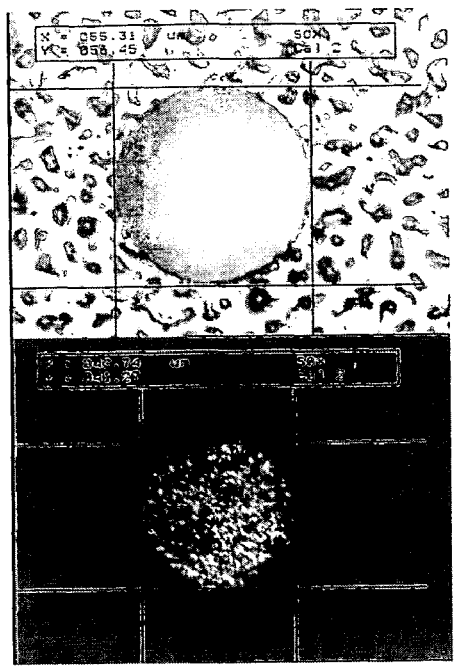
FIGS. 2 and 3 are each a set of four light microscope images showing similarities in quality of 58 μm diameter blind vias drilled in the same copper-clad target material with different lasers emitting pulsed laser beams at the same $F/\sqrt{\tau}$ but with different pulse widths.
Figure 2:
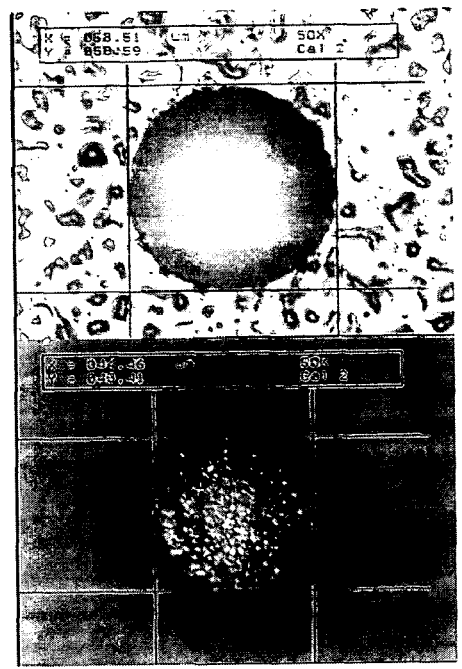
Figure 3:
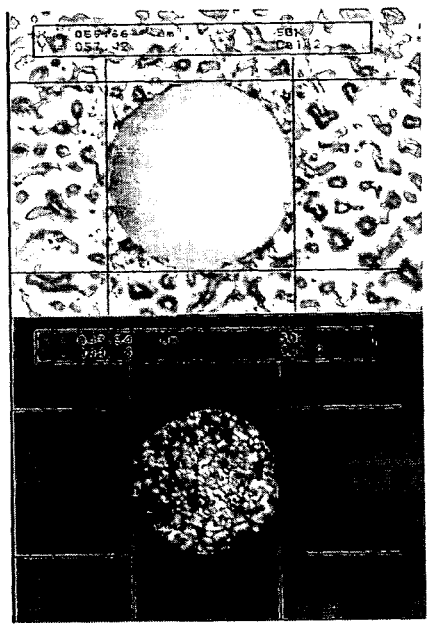
Figure 3:
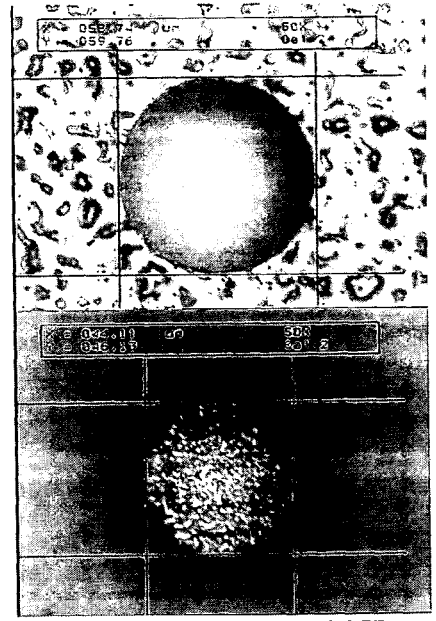

FIGS. 2 and 3 are each a set of four photographs of microscope images that illustrate the effect of the invention on laser drilled via quality. The top two, and bottom two photographs of each of FIGS. 2 and 3 represent the same depths of focus used in the corresponding photographs of FIG. 1. FIGS. 2 and 3 show light microscope images of blind vias drilled in the same material with lasers having is different pulse widths, but the ratio $F/\sqrt{\tau}$ is kept approximately equal instead of F. The bottom photographs show that the surface quality of the bottom copper layer is similar for lasers emitting pulses of different pulse widths as long as the ratio $F/\sqrt{\tau}$ remains constant.

Recognizing that the parameter $F/\sqrt{\tau}$ affects bottom copper layer quality, a system operator can take steps to keep this parameter constant for different ones in the group of lasers to provide more consistent laser processing. For a laser with a pulse width specification having a nominal value, a minimum value, and a maximum value, different lasers in a group can be normalized to one another by normalizing the ratio $F/\sqrt{\tau}$ for each laser in the group. One method of achieving normalization entails normalizing all lasers relative to the nominal pulse width specification so that all of the lasers drill as though each of them is a nominal pulse width laser at any given set of process parameters. The equation to normalize the lasers for this pulse width effect is $$F_{Drill} = F_{nom} \frac{\sqrt{\tau_{Laser}}}{\sqrt{\tau_{nom}}},$$

where $F_{Drill}$ is the fluence to be used during drilling, $F_{nom}$ is the nominal fluence programmed into the laser system for the given process, $\tau_{Laser}$ is the actual pulse width of the laser being used, and $\tau_{nom}$ is the nominal pulse width specification of the laser.

In one typical procedure, an operator sets in a system input device a fluence value specified for a given processing operation. The system has in memory stores previously entered laser parameter data. Laser system software can automatically take the parameters entered for a given process and recalculate a different pulse energy to satisfy the $F/\sqrt{\tau}$ parameter consistent with the quality metric needed for use during drilling, i.e., the pulse energy based on the pulse width of the actual laser being used. This same methodology may also be used for correcting pulse width variations as the laser pulse repetition rate is changed, thereby resulting in consistent via quality for vias drilled at the same programmed fluence and different repetition rates. The pulse width information for the individual laser being used could be either entered into a calibration file based on previous measurements or measured in real time using a pulse detector.

Figure 4:
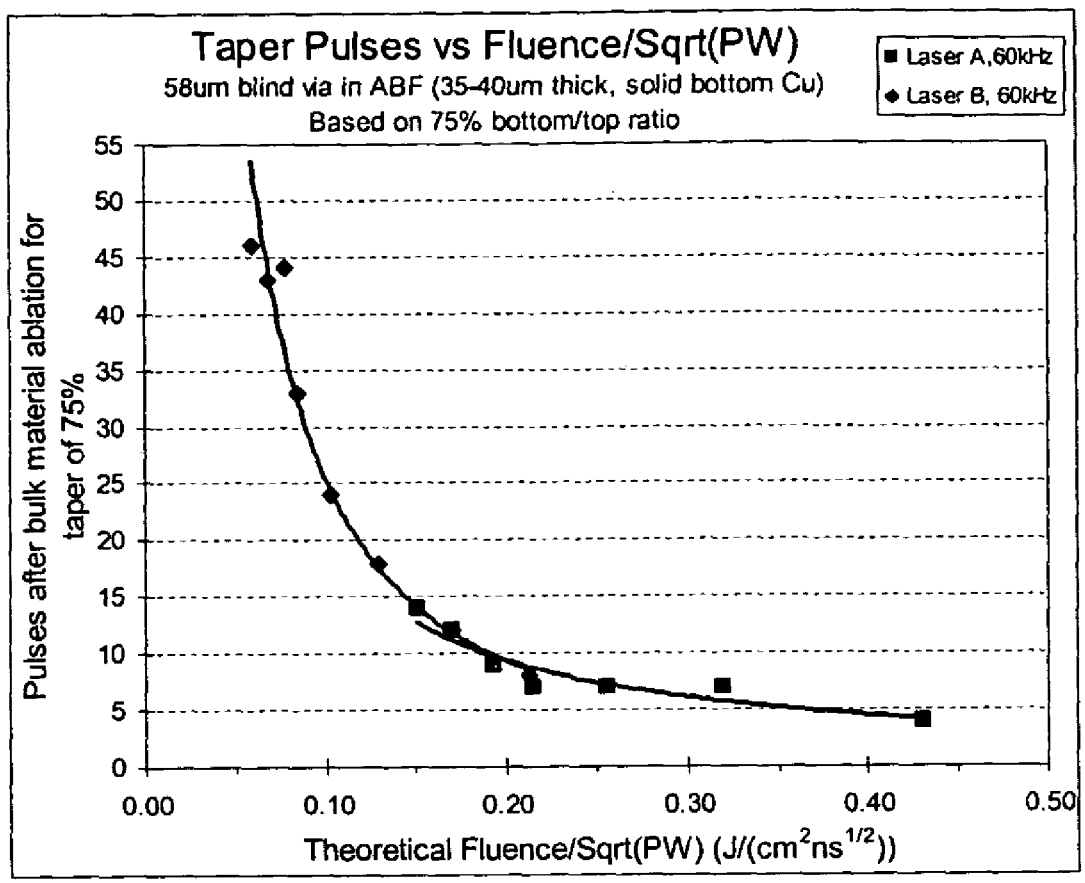
FIG. 4 is a graph showing a curve that represents, for different lasers, as a function of $F/\sqrt{\tau}$ the number of laser pulses ablating bulk Model ABF dielectric target material to form a 58 μm blind via having a taper of 75%.
Figure 5:
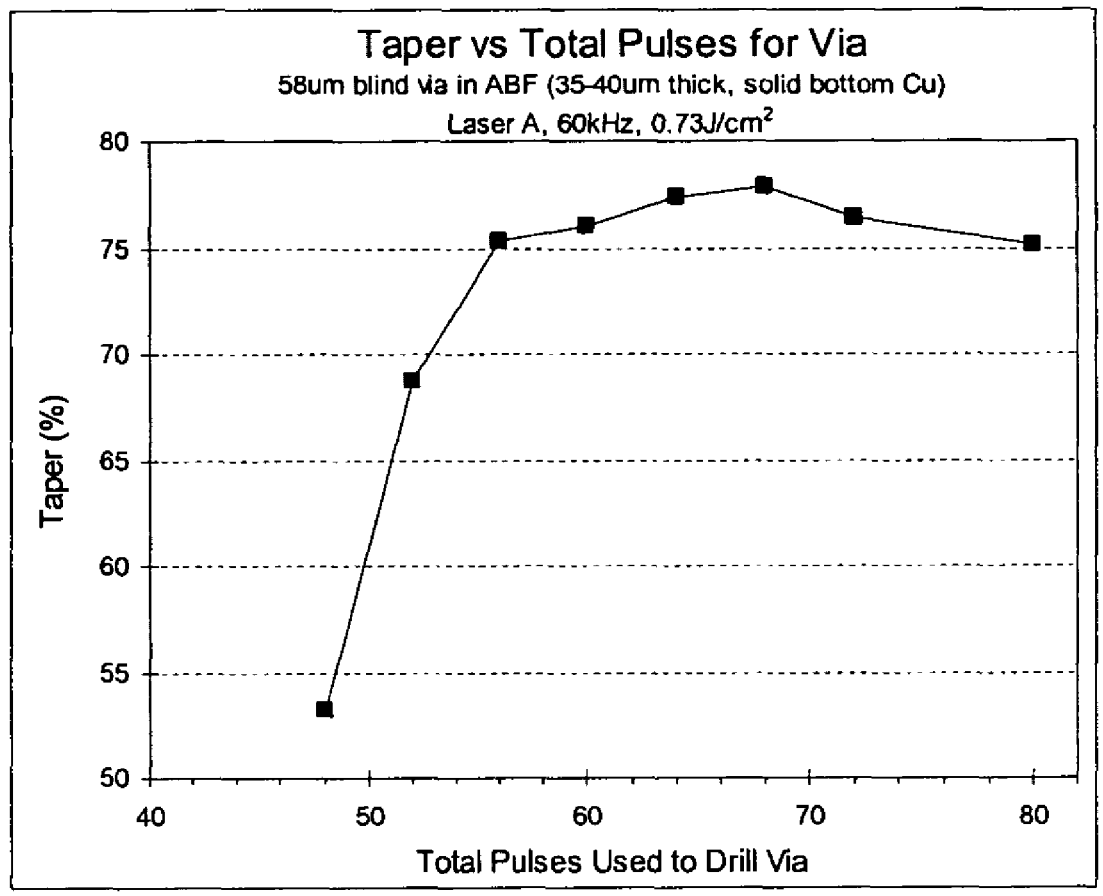
FIG. 5 is a graph showing via taper as a function of a number of laser pulses drilling a 58 μm diameter blind via in Model ABF dielectric target material at a 60 kHz repetition rate and 0.73 J/cm² fluence.

The basis for normalization of pulse energy effects is illustrated by FIGS. 4 and 5, which show the dependence of via taper on the number of pulses for a given pulse energy. Specifically, FIG. 4 shows the minimum number of pulses incident on a target location to achieve a 75% via taper. As FIG. 4 illustrates, a drop in average pulse energy (resulting in a corresponding drop in $F/\sqrt{\tau}$) for a particular via can result in a need to use a greater number of pulses to create a desired taper ratio. FIG. 5 shows that use of fewer than the necessary number of taper pulses results in a via taper lower than that which is desired. To compensate for this pulse energy reduction, the machine control system can detect the pulse energy for a given via in real time and adjust the number of pulses applied to that via in real time to maintain the desired taper. As FIG. 5 illustrates for the example given, the use of 58 pulses achieves a 75% via taper. Additional pulses would be used to achieve better via bottom surface quality. The number of pulses could be either increased or decreased to create the desired taper for the given via, depending on whether the average pulse energy for that via was higher or lower than the programmed pulse energy.

It will be obvious to those having skill in the art that many changes may be made to the details of the above-described embodiments without departing from the underlying principles of the invention. The scope of the present invention should, therefore, be determined only by the following claims.

The invention claimed is:

1. A method of meeting consistently a quality metric specified for regions of target specimen material processed by laser output pulses emitted by different ones of a group of lasers, the laser output pulses before processing of target specimen material characterized by specified pulse width and fluence values, comprising:

specifying a quality metric for laser-processed regions of target specimen material, the quality metric corresponding to a laser processing operation-specific characteristic parameter or physical condition of the target specimen material processed by the laser output pulses;

setting a nominal pulse fluence value, $F_{nom}$, specified for a laser-processing operation to which the quality metric corresponds;

setting a nominal pulse width value, $\tau_{nom}$, specified for the lasers in the group;

obtaining for the group of lasers pulse width information representing an actual pulse width, $\tau_{Laser}$, of each laser in the group; and normalizing all lasers in the group relative to the nominal pulse width value, $\tau_{nom}$, by adjusting the nominal pulse fluence value, $\tau_{nom}$, of the laser output pulses to establish, for each laser in the group, adjusted energy values, F, that cause the regions of target specimen material processed by the laser output pulses to meet consistently the quality metric specified, the adjusting of the nominal pulse fluence value, $\tau_{nom}$, including determining for the lasers in the group adjusted energy values, F, expressed as $$F = F_{nom} \frac{\sqrt{\tau_{Laser}}}{\sqrt{\tau_{nom}}}.$$

2. The method of claim 1, in which each of the lasers in the group emits a series of the laser output pulses, and further comprising changing the number of laser output pulses in the series of one or more of the lasers to process associated regions of the target specimen material in response to detection of a deviation from the adjusted nominal pulse fluence value, $\tau_{nom}$.

3. The method of claim 1, in which the laser processing of target specimen material forms a via in one of the regions of the target specimen material.

4. The method of claim 3, in which the target specimen material includes an ablatable target material having a major surface covered by a metal cladding, and in which the quality metric includes the surface condition of the metal cladding upon removal of the ablatable target material to form the via.

5. The method of claim 1, in which the pulse width information is obtained from previously taken pulse width measurements.

6. The method of claim 1, in which the pulse width information is obtained by a pulse detector taking pulse width measurements in real time.

* * * * *